(12) United States Patent
Ding et al.

(10) Patent No.: US 10,816,739 B2
(45) Date of Patent: Oct. 27, 2020

(54) HORIZONTAL FLEX CIRCUIT WITH RESISTANCE WELDABLE COVER

(71) Applicant: Finisar Corporation, Sunnyvale, CA (US)

(72) Inventors: Frank Lei Ding, Milpitas, CA (US); Maziar Amirkiai, Sunnyvale, CA (US); Jianwei Mu, Pleasanton, CA (US); Hongyu Deng, Saratoga, CA (US); Tao Wu, Union City, CA (US)

(73) Assignee: II-VI Delaware Inc., Wilmington, DE (US)

( * ) Notice: Subject to any disclaimer, the term of this patent is extended or adjusted under 35 U.S.C. 154(b) by 0 days.

(21) Appl. No.: 16/600,194

(22) Filed: Oct. 11, 2019

(65) Prior Publication Data

US 2020/0116961 A1 Apr. 16, 2020

Related U.S. Application Data

(60) Provisional application No. 62/746,150, filed on Oct. 16, 2018.

(51) Int. Cl.
*G02B 6/42* (2006.01)

(52) U.S. Cl.
CPC ......... *G02B 6/4256* (2013.01); *G02B 6/4269* (2013.01); *G02B 6/4281* (2013.01); *G02B 6/4286* (2013.01); *G02B 6/4204* (2013.01); *G02B 6/4237* (2013.01); *G02B 6/4292* (2013.01)

(58) Field of Classification Search
CPC .. G02B 6/4204; G02B 6/4237; G02B 6/4256; G02B 6/4269; G02B 6/4281; G02B 6/4286; G02B 6/4292; H05K 1/189; H05K 2201/10121
See application file for complete search history.

(56) References Cited

U.S. PATENT DOCUMENTS

| | | | |
|---|---|---|---|
| 7,090,509 B1 * | 8/2006 | Gilliland | G02B 6/4246 385/92 |
| 9,337,932 B2 * | 5/2016 | Stapleton | G02B 6/4295 |
| 9,671,580 B1 * | 6/2017 | Nagarajan | H04B 1/3833 |
| 10,036,861 B1 | 7/2018 | Ding et al. | |
| 2013/0156418 A1 | 6/2013 | Stapleton et al. | |
| 2017/0123173 A1 | 5/2017 | Ding et al. | |

FOREIGN PATENT DOCUMENTS

EP 1298471 A1 4/2003

OTHER PUBLICATIONS

International Search Report and Written Opinion dated Jan. 28, 2020, in related PCT Application No. PCT/US2019/056575 (12 pages).

* cited by examiner

*Primary Examiner* — Daniel Petkovsek
(74) *Attorney, Agent, or Firm* — Maschoff Brennan

(57) ABSTRACT

A resistance weldable cover for an OSA may include multiple walls, one or more supports, and an opening disposed in one of the walls. The walls may define an interior cavity within the walls. The one or more supports may extend from one or more of the walls. Each of the one or more supports may be weldable to a heat sink stiffener. The opening may be sized and shaped to receive at least a portion of a barrel such that optical signals are transmittable between the interior cavity and the barrel.

20 Claims, 8 Drawing Sheets

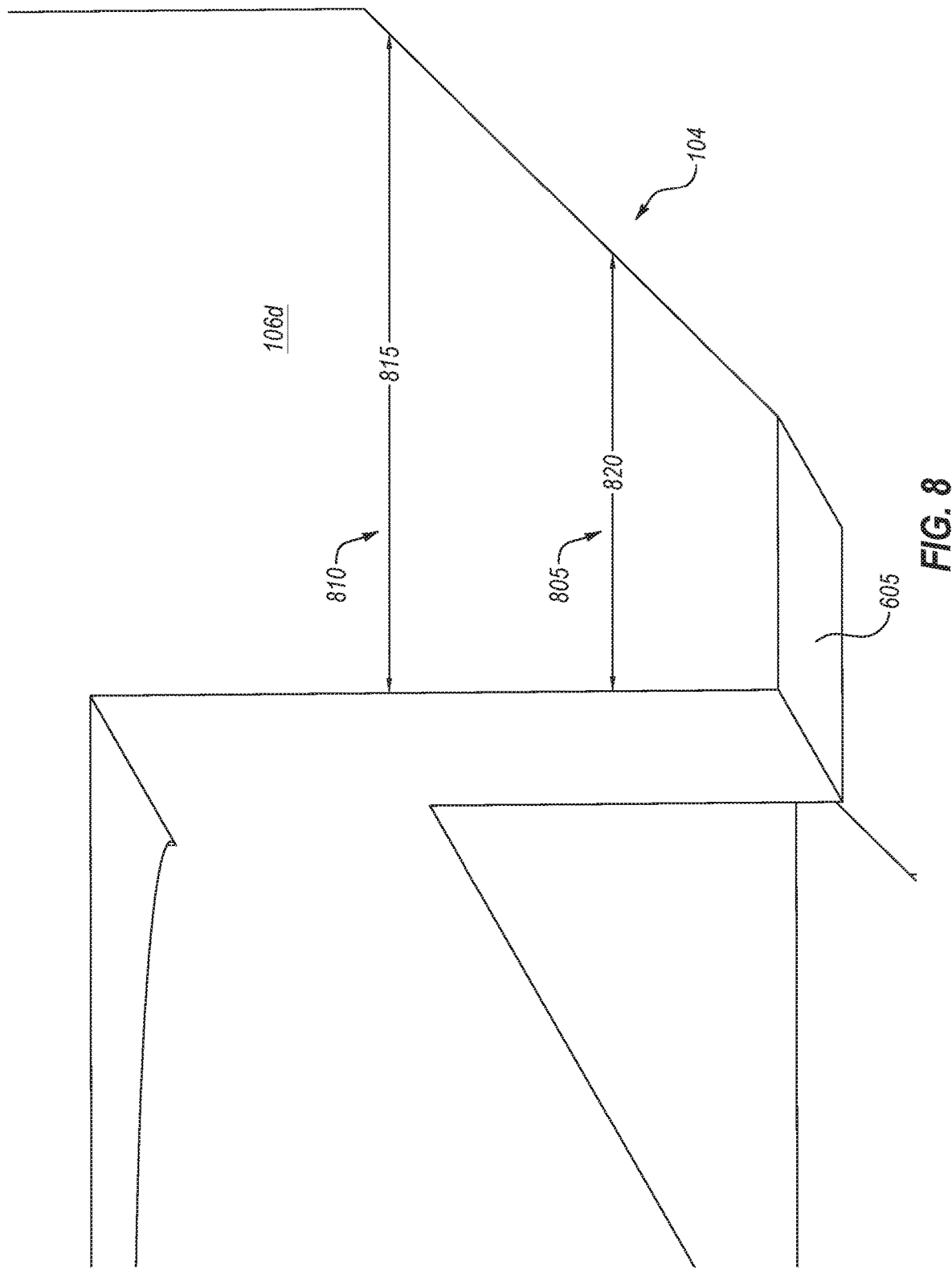

HORIZONTAL FLEX CIRCUIT WITH RESISTANCE WELDABLE COVER

CROSS-REFERENCE TO RELATED APPLICATION

This application claims the benefit of and priority to U.S. Provisional App. No. 62/746,150 filed Oct. 16, 2018 which is incorporated herein by reference.

FIELD

This application relates generally to a horizontal flex circuit with a resistance weldable cover.

BACKGROUND

Unless otherwise indicated herein, the materials described herein are not prior art to the claims in the present application and are not admitted to be prior art by inclusion in this section.

Optoelectronic components may be used in the conversion of optical signals to electrical signals and/or the conversion of electrical signals to optical signals. In some cases, the optoelectronic components may be covered or housed within and/or by a cover.

The subject matter claimed herein is not limited to embodiments that solve any disadvantages or that operate only in environments such as those described above. Rather, this background is only provided to illustrate one example technology area where some embodiments described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some embodiments described in this disclosure generally relate to a weldable cover, e.g., that may be implemented as or in one or more optoelectronic devices and/or modules. In an example embodiment, the cover may include a group of walls that defines an interior cavity within the group of walls. Additionally, the cover may include one or more supports that extend from one or more walls of the group of walls, in which each of the one or more supports may be weldable to a heat sink stiffener. The cover may also include an opening disposed in a wall of the group of walls, in which the opening may be sized and shaped to receive at least a portion of a barrel such that optical signals are transmittable between the interior cavity and the barrel.

In another example embodiment, an optical subassembly may include a heat sink stiffener, a barrel, a cover, and a flex circuit. The cover may include a group of walls that defines an interior cavity within the group of walls. Additionally, the cover may include one or more supports that extend from one or more walls of the group of walls, in which each of the one or more supports may be weldable to a heat sink stiffener. The cover may also include an opening disposed in a wall of the group of walls, in which the opening may be sized and shaped to receive at least a portion of the barrel such that optical signals are transmittable between the interior cavity and the barrel. The flex circuit may include a portion of the flex circuit received into the interior cavity and a portion positioned externally.

In another example embodiment, a module may include a housing that defines a housing cavity. Additionally, the module may include a heat sink stiffener disposed within the housing cavity. The module may also include a barrel disposed within the housing cavity. Additionally, the module may include a cover disposed within the housing cavity, in which the cover may include a group of walls that defines an interior cavity within the group of walls. Additionally, the cover may include one or more supports that extend from one or more walls of the group of walls, in which each of the one or more supports may be weldable to a heat sink stiffener. The cover may also include an opening disposed in a wall of the group of walls, in which the opening may be sized and shaped to receive at least a portion of a barrel such that optical signals are transmittable between the interior cavity and the barrel. Additionally, the module may include a flex circuit disposed within the housing cavity, in which at least a portion of the flex circuit may be received into the interior cavity and another portion positioned external to the cover. The flex circuit may be communicatively coupled to a host device.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present disclosure, a more particular description of the disclosure will be rendered by reference to specific embodiments thereof which are illustrated in the appended drawings. It is appreciated that these drawings depict only typical embodiments of the disclosure and are therefore not to be considered limiting of its scope. The disclosure will be described and explained with additional specificity and detail through the use of the accompanying drawings in which:

FIG. 8 is a detail view of a support of the cover of FIG. 1, all arranged in accordance with at least one embodiment described herein.

DESCRIPTION OF EMBODIMENTS

In some embodiments, an optical subassembly (OSA) may include a cover that is attached to a stiffener such that optoelectronic components disposed between the stiffener and the cover (e.g., within the cover) may be protected, hermetically sealed, and/or at least partially enclosed. In some cases, the cover may be attached to the stiffener using a solder sealing process or a laser welding process. However, the solder sealing process and the laser welding process may involve high manufacturing costs. High manufacturing costs may include increased expenses due to time, labor, and/or materials. Accordingly, one or more embodiments disclosed herein relate to a cover attachable to a stiffener via resistance welding. Such a cover may be referred to as a resistance weldable cover. The resistance weldable cover may result in lower manufacturing costs relative to the solder sealing and laser welding processes discussed above.

Reference will now be made to the drawings to describe various aspects of example embodiments of the present disclosure. It is to be understood that the drawings are diagrammatic and schematic representations of such example embodiments, and are not limiting of the present invention, nor are they necessarily drawn to scale.

Figure 1:
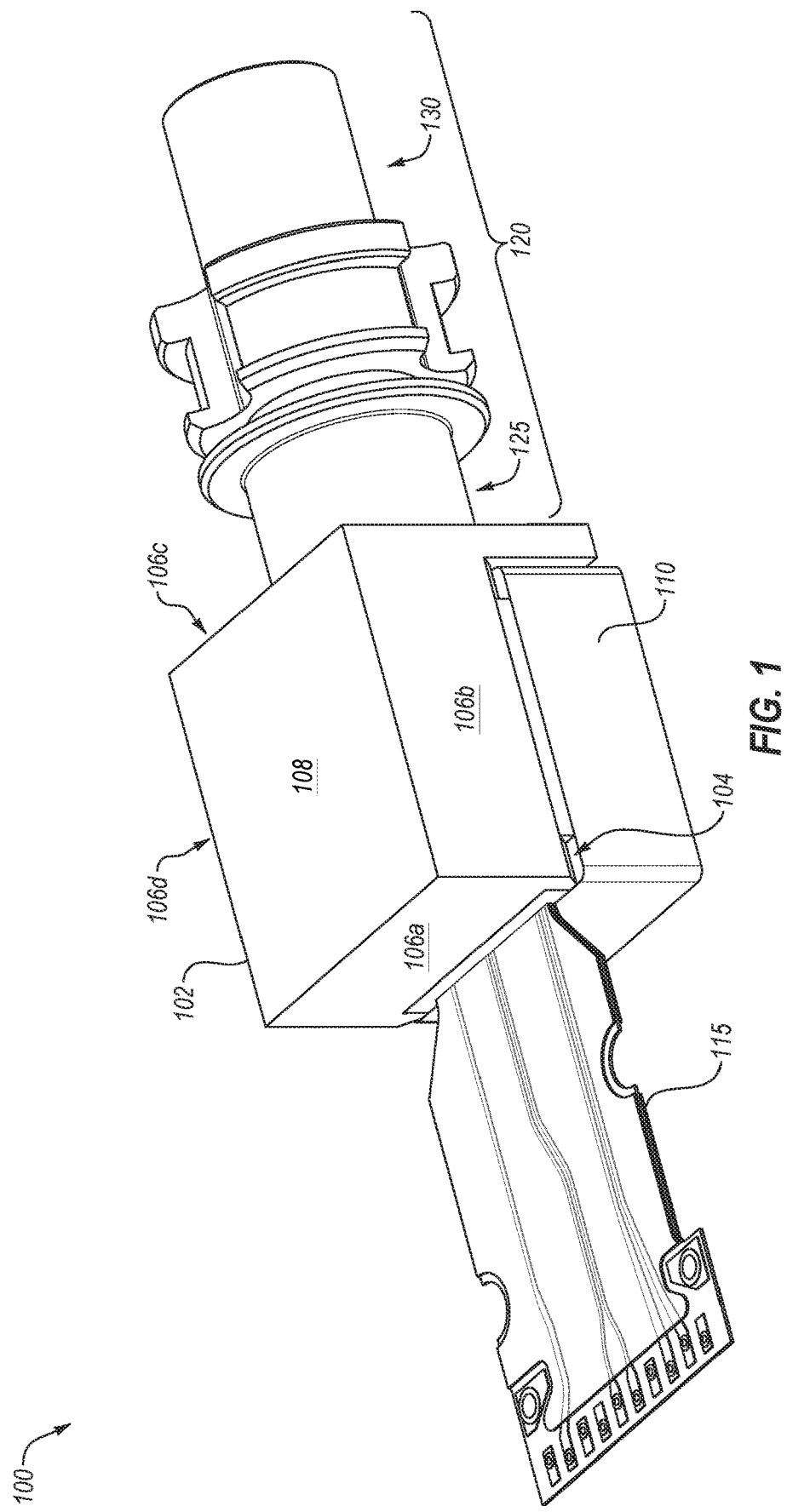
FIG. 1 illustrates an example transmitter optical subassembly (TOSA) of an example optoelectronic module/device.

FIG. 1 illustrates an example TOSA 100 of an example optoelectronic module/device, arranged in accordance with at least one embodiment described herein. As illustrated, the TOSA 100 may include a cover 102, a heat sink stiffener 110, a flex circuit 115, and a barrel 120 having a first barrel portion 125 and a second barrel portion 130. The cover 102 may include a support 104 and multiple walls, including a first sidewall 106a, a second sidewall 106b, a third sidewall 106c, a fourth sidewall 106d (collectively "sidewalls 106"), and a top wall 108.

In some embodiments, the cover 102 may be a weldable cover that protects and/or seals certain components (e.g., as described with respect to FIG. 2) inside a cavity or an interior cavity defined by the cover 102 and the heat sink stiffener 110. For example, one or more portions of the cover 102 may be welded to a surface of another object, e.g., via a resistance welding process. The resistance welding process may include, e.g., resistance spot welding, resistance projection welding, resistance seam welding, resistance butt welding, or other suitable resistance welding process. In these or other embodiments, the support 104 may be weldable to the heat sink stiffener 110. The support 104 may extend from one or more walls (e.g., the first sidewall 106a and/or the second sidewall 106b of the cover 102). The support 104 may include a welding surface (e.g., the welding surface 605 of FIG. 6). The welding surface may be positioned, relative to other portions of the support 104, farthest from one or more sidewalls of the cover 102 such as the first sidewall 106a and/or the second sidewall 106b. The welding surface of the support 104 may be a surface at which a weld is configured to bond the support 104 of the cover 102 with the heat sink stiffener 110. In these or other embodiments, the cover 102 may include multiple supports 104. When multiple supports 104 are included, the supports may be separated at a desired or predetermined spacing, at corners of the cover 102, and/or in other arrangements or locations at bottoms of the walls (e.g., sidewalls 106a, 106b) of the cover 102.

In some embodiments, the heat sink stiffener 110 may include a heat sink, such as a local heat sink or a global heat sink. For example, heat transfer from one or more components positioned inside the interior cavity of the cover 102 may occur via thermal coupling to the heat sink stiffener 110.

The flex circuit 115 may be bonded, soldered, or otherwise coupled to one or more components positioned inside the interior cavity of the cover 102.

In some embodiments, the first barrel portion 125 of the barrel 120 may be received into and/or coupled to the cover 102. The second barrel portion 130 of the barrel 120 may receive a ferrule, e.g., of a fiber optic line/cable/connector. The barrel 120 may include one or more of a sleeve, a fitting, an isolator (e.g., for optical signal feedback control), and/or other component(s). Optical signals may be transmitted out of the interior cavity within the cover 102 through the barrel 120.

Modifications, additions, or omissions may be made to the TOSA 100 of FIG. 1 without departing from the scope of the present disclosure. For example, in some embodiments, the TOSA 100 may include any number of other components that may not be explicitly illustrated or described. Further, depending on certain implementations, the TOSA 100 may not include one or more of the components illustrated and described. Alternatively, the TOSA 100 may instead be implemented as a receiver optical subassembly (ROSA), in which case the ROSA may include an optical receiver, or as a bidirectional optical subassembly (BOSA), in which case the BOSA may include both an optical transmitter and an optical receiver.

Figure 2:
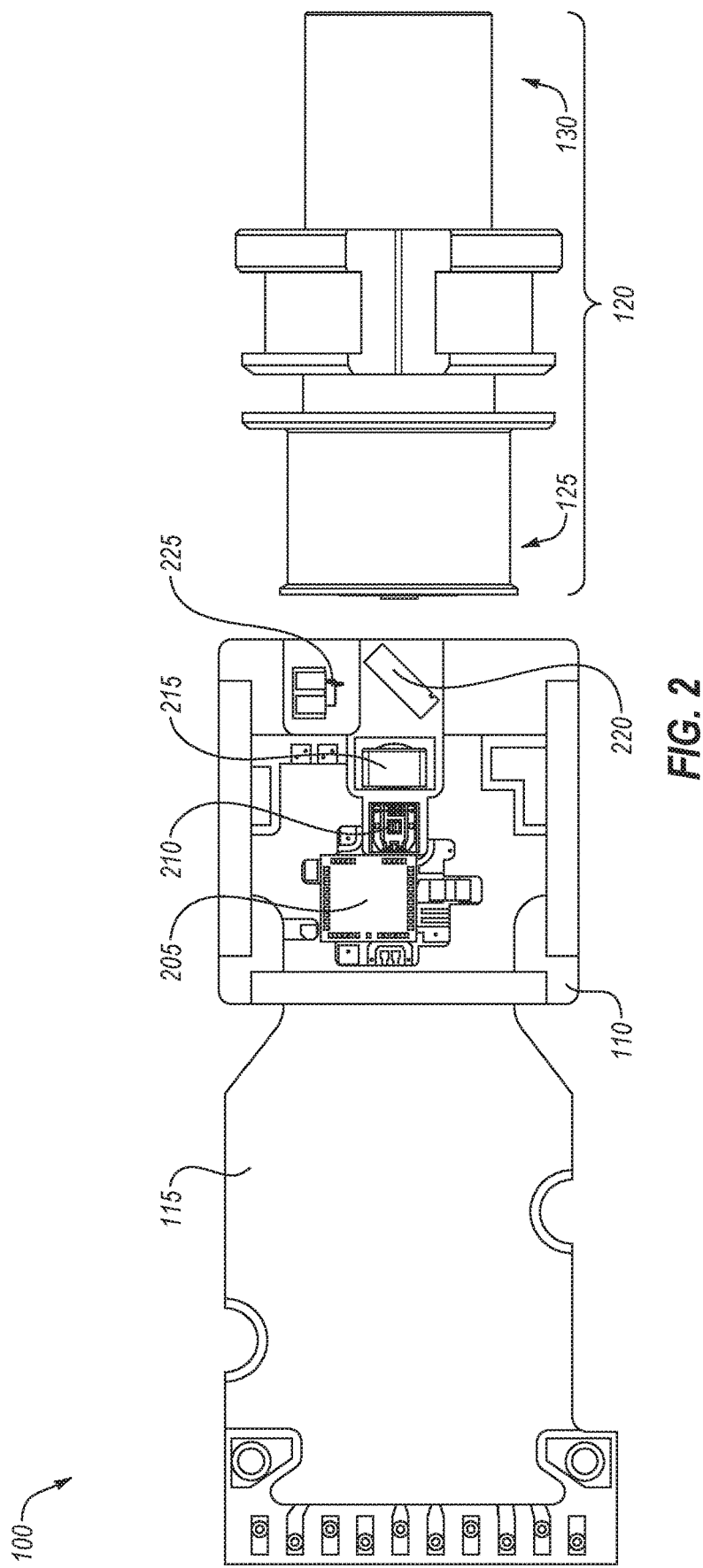
FIG. 2 is a top view of the TOSA of FIG. 1.

FIG. 2 is a top view of the TOSA 100 of FIG. 1, arranged in accordance with at least one embodiment described herein. In FIG. 2, the cover 102 is omitted to reveal some example components inside the interior cavity of the cover 102. FIG. 2 illustrates the heat sink stiffener 110, the flex circuit 115, and the barrel 120 having the first barrel portion 125 and the second barrel portion 130. As further illustrated in FIG. 2, some example components positioned inside the cover 102 may include a driver 205, a laser 210, a lens 215, a beam splitter 220, and a power detection monitor (PDM) 225.

In some embodiments, the driver 205 may drive the laser 210. For example, the driver 205 may convert an electrical data signal into a drive signal suitable to drive the laser 210 to emit an optical signal that represents the electrical data signal. In some embodiments, other electrical components may be positioned inside the interior cavity of the cover 102, such as a receiver chip that may include a TIA chip (transimpedance amplifier chip) and/or a LIA chip (limiting impedance amplifier chip). The TIA/LIA chips may include data pins/pads that can receive/transmit the electrical data signals to/from a host device/system and connecting pads that can connect to one or more optical components, e.g., connecting pins/pads that connect to light sources or photo detectors. Other electrical components may include a microcontroller unit (MCU) and an integrated circuit (IC).

In some embodiments, the laser 210 may include an edge emitting laser, a fabry-perot (FP) laser, a distributed feedback (DFB) laser, a distributed Bragg reflector (DBR) laser, a vertical cavity surface emitting laser (VCSEL), a grating coupled laser (GCL), or other suitable laser. The laser 210 may emit an optical signal through the lens 215 and the beam splitter 220. The lens 215 may focus the optical signal. The beam splitter 220 may split a portion of the optical signal. For example, the beam splitter 220 may be a 95/5 beam splitter that diverts five percent of the optical signal toward the PDM 225 and transmits the remaining ninety-five percent of the optical signal toward the barrel 120 to be transmitted through the barrel 120 and into an optical fiber of an optical network. In these or other embodiments, the PDM 225 may receive the diverted portion (e.g., five percent) of the optical signal to monitor the power output of the laser 210.

Figure 3:
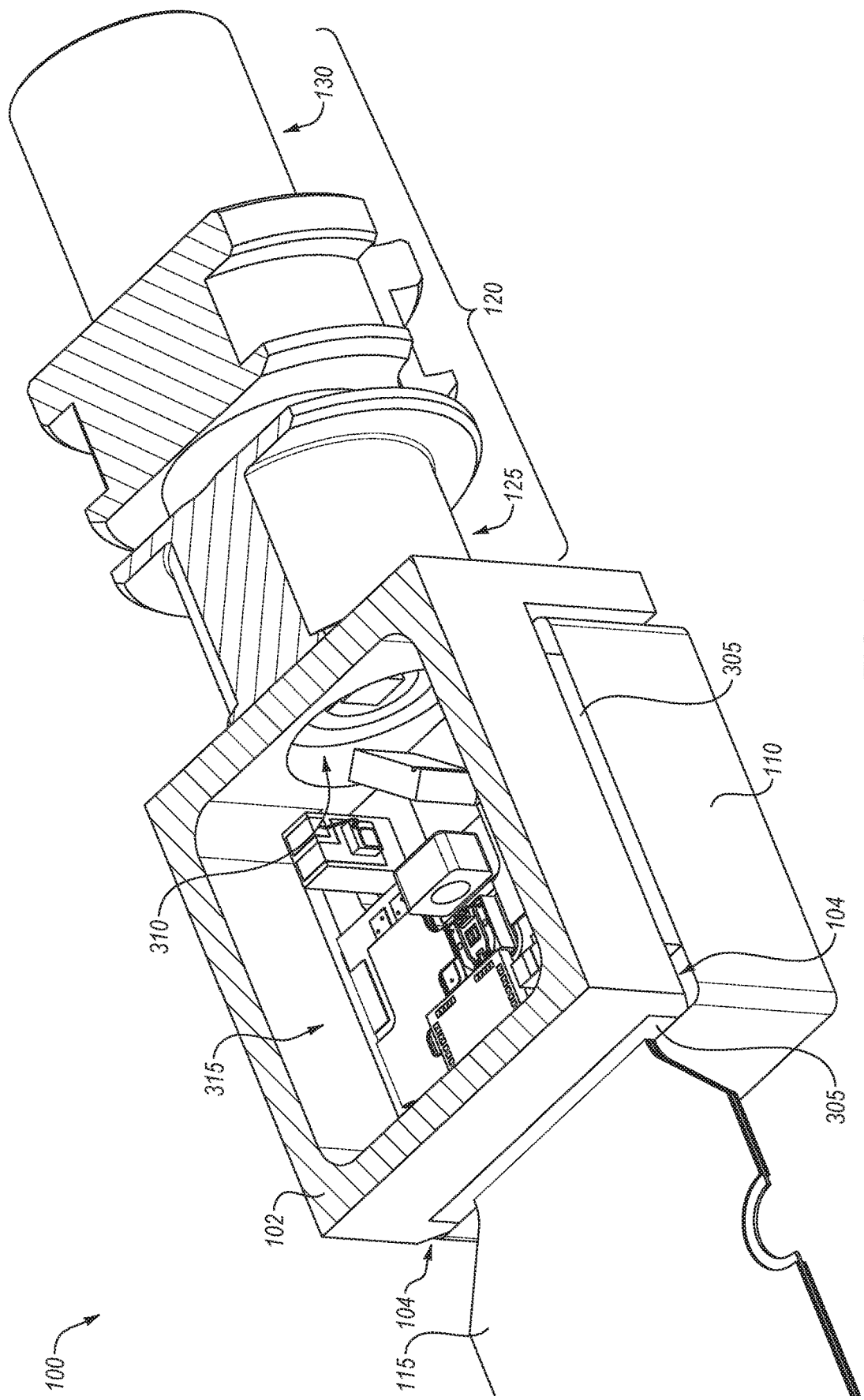
FIG. 3 is a cross-sectional top perspective view of the TOSA of FIG. 1.

FIG. 3 is a cross-sectional top perspective view of the TOSA 100 of FIG. 1, arranged in accordance with at least one embodiment described herein. In FIG. 3, the cross-section is taken parallel to and below the top wall 108 (FIG. 1) of the cover 102. FIG. 3 illustrates the cover 102, the supports 104, the heat sink stiffener 110, the flex circuit 115, and the barrel 120 having the first barrel portion 125. FIG. 3 further illustrates a filler 305, an opening 310, and an interior cavity 315.

In some embodiments, the filler 305 may be positioned in gaps between the heat sink stiffener 110 and the cover 102. Each gap may be defined between a lower surface of the cover 102 and an upper surface of the heat sink stiffener 110 and/or between a lower surface of the cover 102 and an upper surface of the flex circuit 115. For simplicity, each gap will be discussed as being defined between the lower surface of the cover 102 and the upper surface of the heat sink stiffener 110, but such discussion may generally apply for any gap defined between the lower surface of the cover 102 and the upper surface of the flex circuit 115 or other component(s). Additionally or alternatively, the gap may be defined by a height of the supports 104 that may define a distance between the lower surface of the cover 102 and the upper surface of the heat sink stiffener 110. Additionally or alternatively, the gap may be defined by a distance between adjacent ones of the supports 104 (e.g., between two adjacent supports 104).

In these or other embodiments, the filler 305 may be configured to fill each gap. The filler 305 may include a filler material that hermetically seals the interior cavity 315. In other embodiments, the filler 305 may not hermetically seal the interior cavity 315 and/or the filler 305 may be omitted altogether. Additionally or alternatively, the filler 305 may include a filler material such as a bonding agent that is configured to bond together portions of the lower surface of the cover 102 and portions of the upper surface of the heat sink stiffener 110 and/or the flex circuit 115. Examples of the filler 305 may include epoxy, braze, or other suitable filler/bond. In these or other embodiments, the filler 305 may add, e.g., support, rigidity, protection, and/or vibration damping to one or more elements of the TOSA 100.

In some embodiments, the gap configured to be filled by the filler 305 may enable one or more elements to be routed into/out of the interior cavity 315. For example, the gap between a pair of supports 104 may be sized and shaped to receive a portion of the flex circuit 115 into the interior cavity 315. The filler 305 may be positioned around the flex circuit 115 in the gap. In these or other embodiments, the filler 305 may add support, rigidity, protection, and/or vibration damping to the flex circuit 115.

In some embodiments, the opening 310 may be disposed in one of the walls of the cover 102, such as a third sidewall 106c. The opening 310 may be sized and shaped to receive a portion of the barrel 120 (e.g., a portion of the first barrel portion 125) to couple the barrel 120 to the cover 102. The interior cavity 315 may be sized and shaped according to a desired footprint and/or according to the various components discussed with respect to FIG. 2 that are positioned within the interior cavity 315. Additionally or alternatively, the interior cavity 315 may be defined according to one or more of the walls of the cover 102 (e.g., the sidewalls 106, and/or the top wall 108 of FIG. 1).

Figure 4:
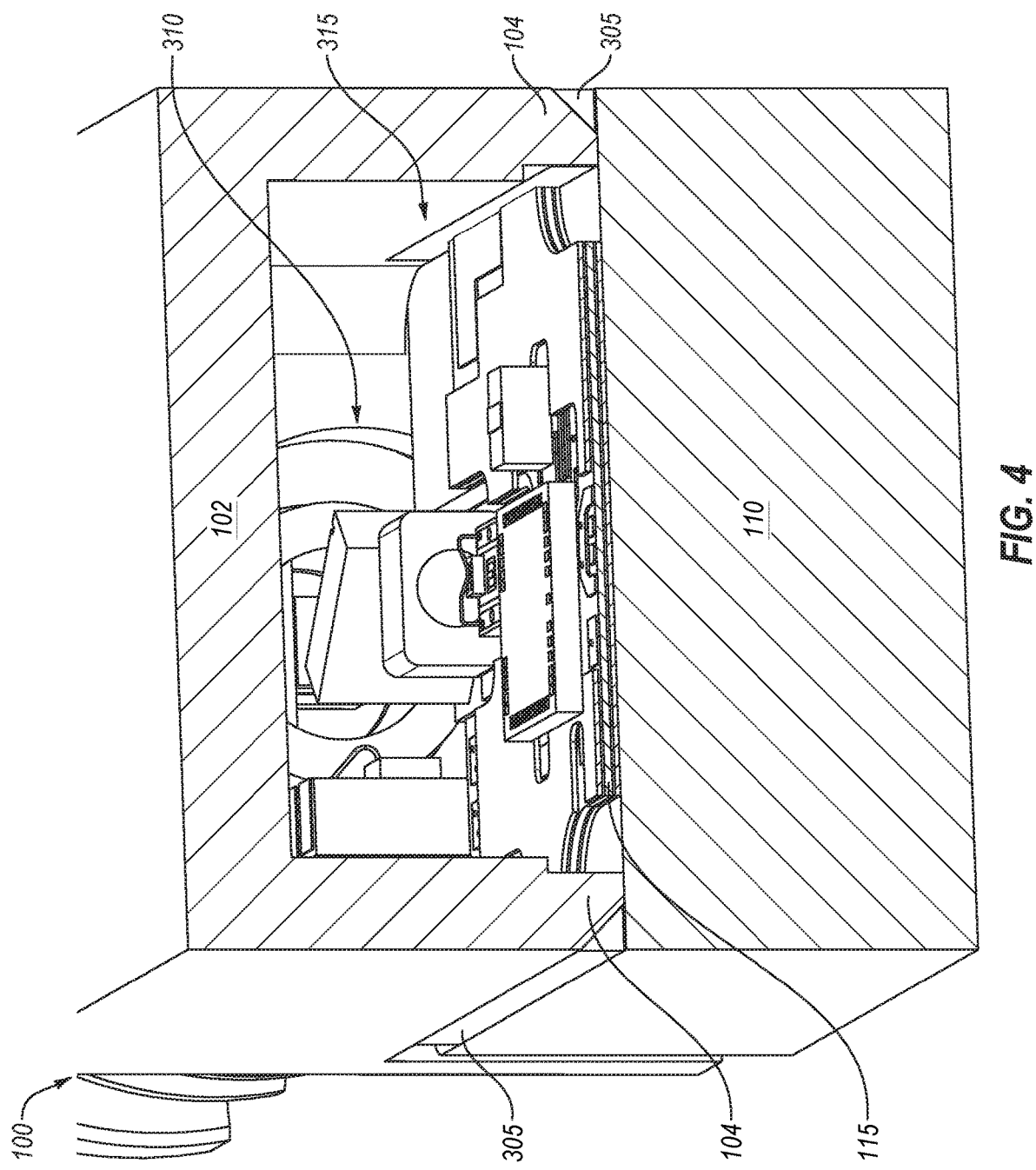
FIG. 4 is a cross-sectional front perspective view of the TOSA of FIG. 1.

FIG. 4 is a cross-sectional front perspective view of the TOSA 100 of FIG. 1, arranged in accordance with at least one embodiment described herein. In FIG. 4, the cross-section is taken parallel to and behind the first sidewall 106a looking toward a rear of the cover 102. FIG. 4 illustrates the cover 102, the supports 104, the heat sink stiffener 110, and the flex circuit 115. FIG. 4 further illustrates the filler 305, the opening 310, and the interior cavity 315.

Figure 5:
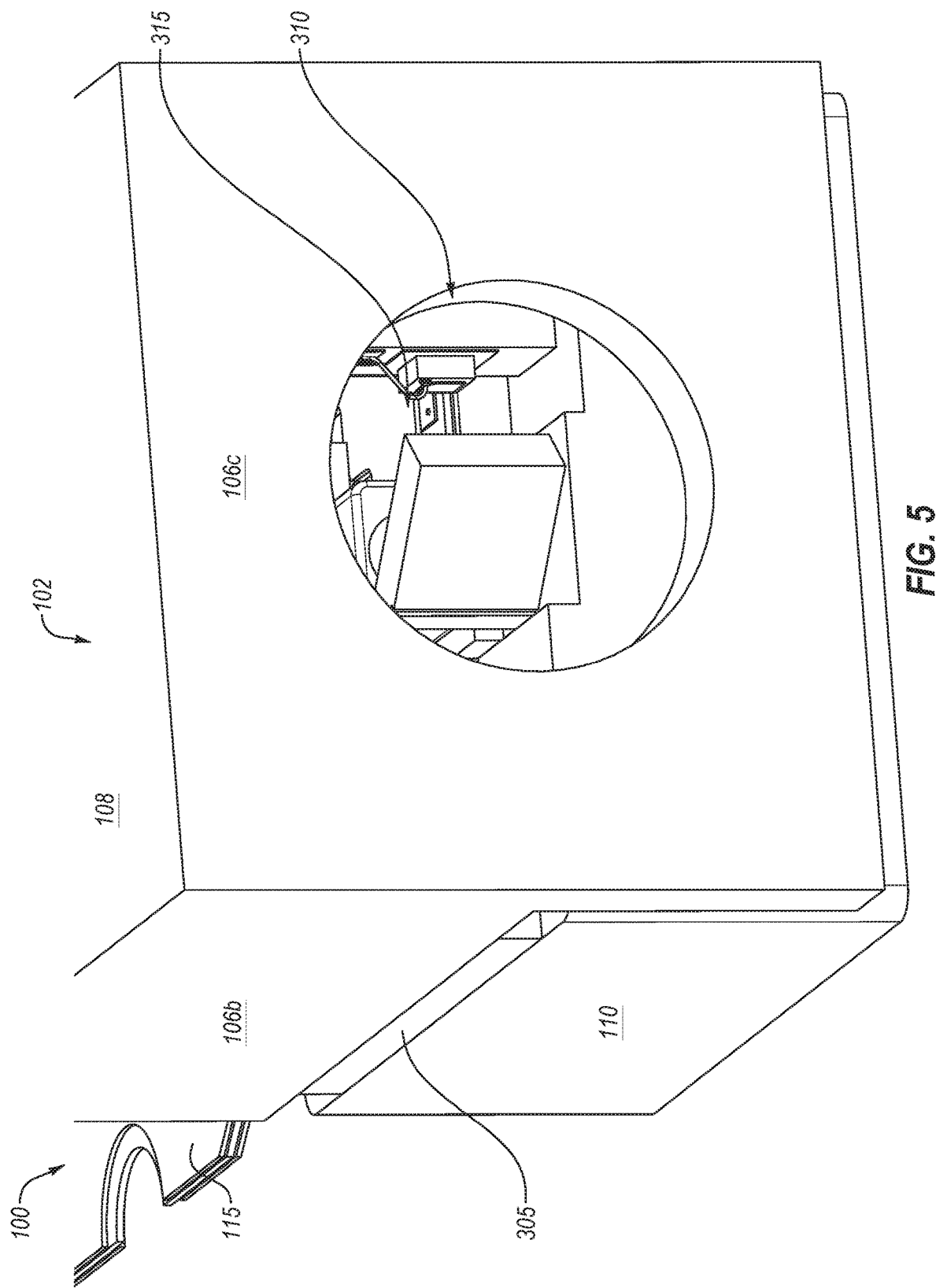
FIG. 5 is a rear perspective view of the TOSA of FIG. 1.

FIG. 5 is a rear perspective view of the TOSA 100 of FIG. 1, arranged in accordance with at least one embodiment described herein. In FIG. 5, the barrel 120 is omitted for illustration purposes. FIG. 5 illustrates the cover 102, the heat sink stiffener 110, the filler 305, and the flex circuit 115. FIG. 5 further illustrates the second sidewall 106b, the third sidewall 106c in which the opening 310 is disposed and opens into the interior cavity 315, and the top wall 108 of the cover 102.

Figure 6:
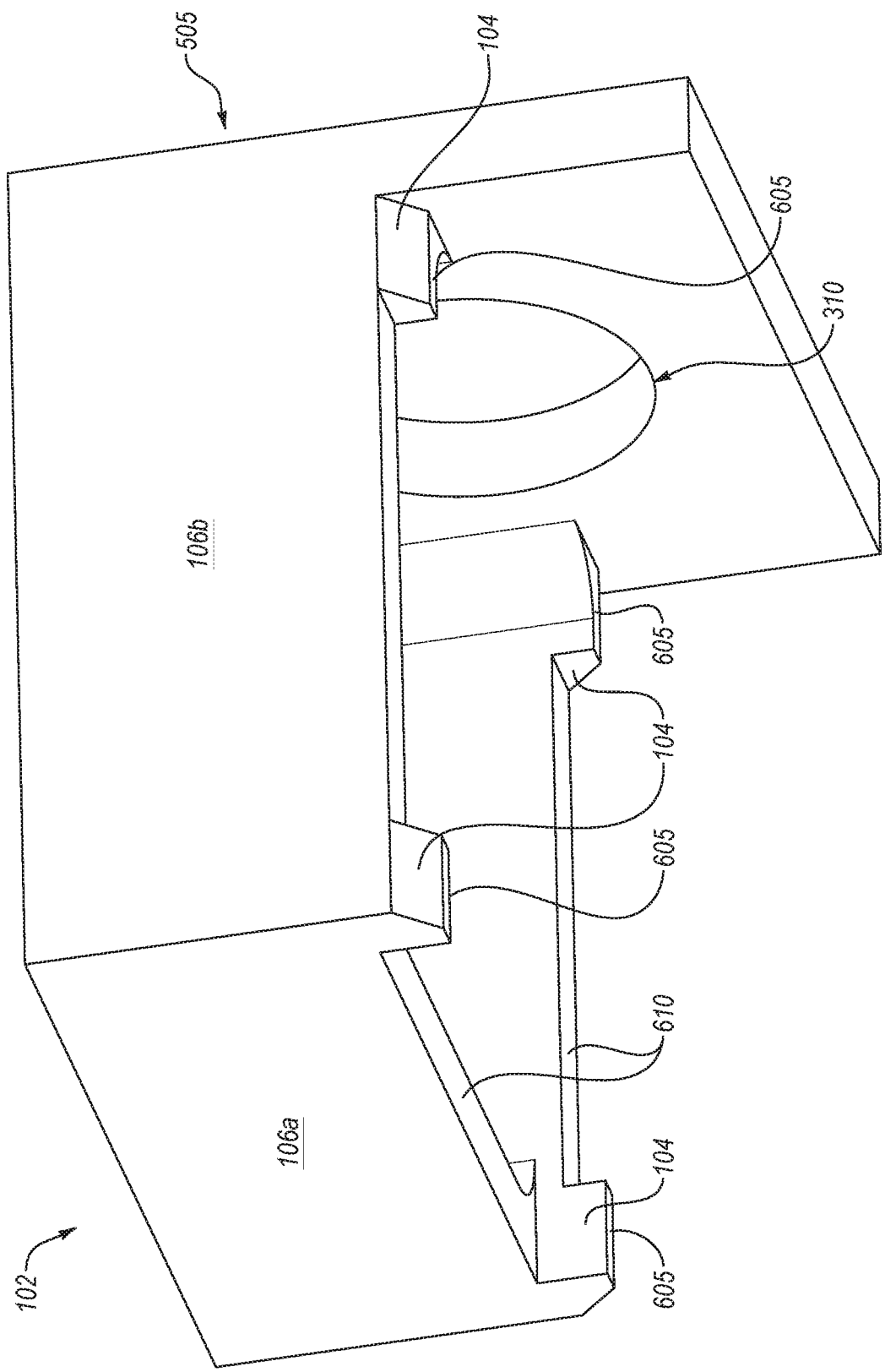
FIG. 6 is a front perspective view of a cover of the TOSA of FIG. 1.

FIG. 6 is a front perspective view of the cover 102 of FIG. 1, arranged in accordance with at least one embodiment described herein. The cover 102 includes the sidewalls 106, the top wall 108 (not visible in FIG. 6), the supports 104, the opening 310, welding surfaces 605, and gap surfaces 610 (also referred to as lower surfaces of the cover 102 elsewhere herein).

In some embodiments, the supports 104 may each include a corresponding welding surface 605. The welding surfaces 605 may be positioned, relative to other portions of the support 104, farthest from a corresponding one of the sidewalls 106 from which the supports downwardly extend. The welding surfaces 605 of the supports 104 may be surfaces at which a weld is configured to bond the supports 104 and thus the cover 102 with the heat sink stiffener 110. In these or other embodiments, the welding surfaces 605 may be parallel to a top portion or top surface of the heat sink stiffener 110, the gap surfaces 610, and/or the top wall 108 (not shown) of the cover 102. Additionally or alternatively, the welding surfaces 605 may be perpendicular to one or more walls of the cover 102 such as the sidewalls 106. In these or other embodiments, the horizontal extent of welding surfaces 605 may not exceed one or more respective planes defined by one or more of the sidewalls 106 of the cover 102. For example, the two supports 104 that extend downward from the second sidewall 106b may have welding surfaces 605 that do not extend beyond two planes defined by inner and outer surfaces of the second sidewall 106b. Alternatively or additionally, front surfaces of the two supports 104 that extend downward from the first sidewall 106a may be flush with, e.g., in a same plane as, a front surface of the first sidewall 106a. In these or other embodiments, the welding surfaces 605 may not extend horizontally beyond the respective planes defined by the inner and/or outer surfaces of the sidewalls 106 from which the supports 104 downwardly extend. Alternatively or additionally, due to a taper of the supports 104, some of the welding surfaces 605 may not extend as far as, e.g., a plane defined by the exterior surface of the corresponding one of the sidewalls 106 from which the supports 104 downwardly extend.

In some embodiments, the gap surfaces 610 may correspond to the lower surface of the cover 102 that is configured to interface with the filler 305 described with respect to FIG. 3. In these or other embodiments, the gap surfaces 610 may be the same or similar to each other. The gap surface 610 corresponding to the first sidewall 106a may be raised higher (e.g., farther from the welding surfaces 605) than the gap surface 610 corresponding to the second sidewall 106b, e.g., to accommodate the flex circuit 115. Additionally or alternatively, the gap surfaces 610 may be bonding surfaces, controlled surfaces, supporting surfaces, and/or component-interfacing surfaces (e.g., configured to interface with the flex circuit 115 of FIG. 1).

Figure 7:
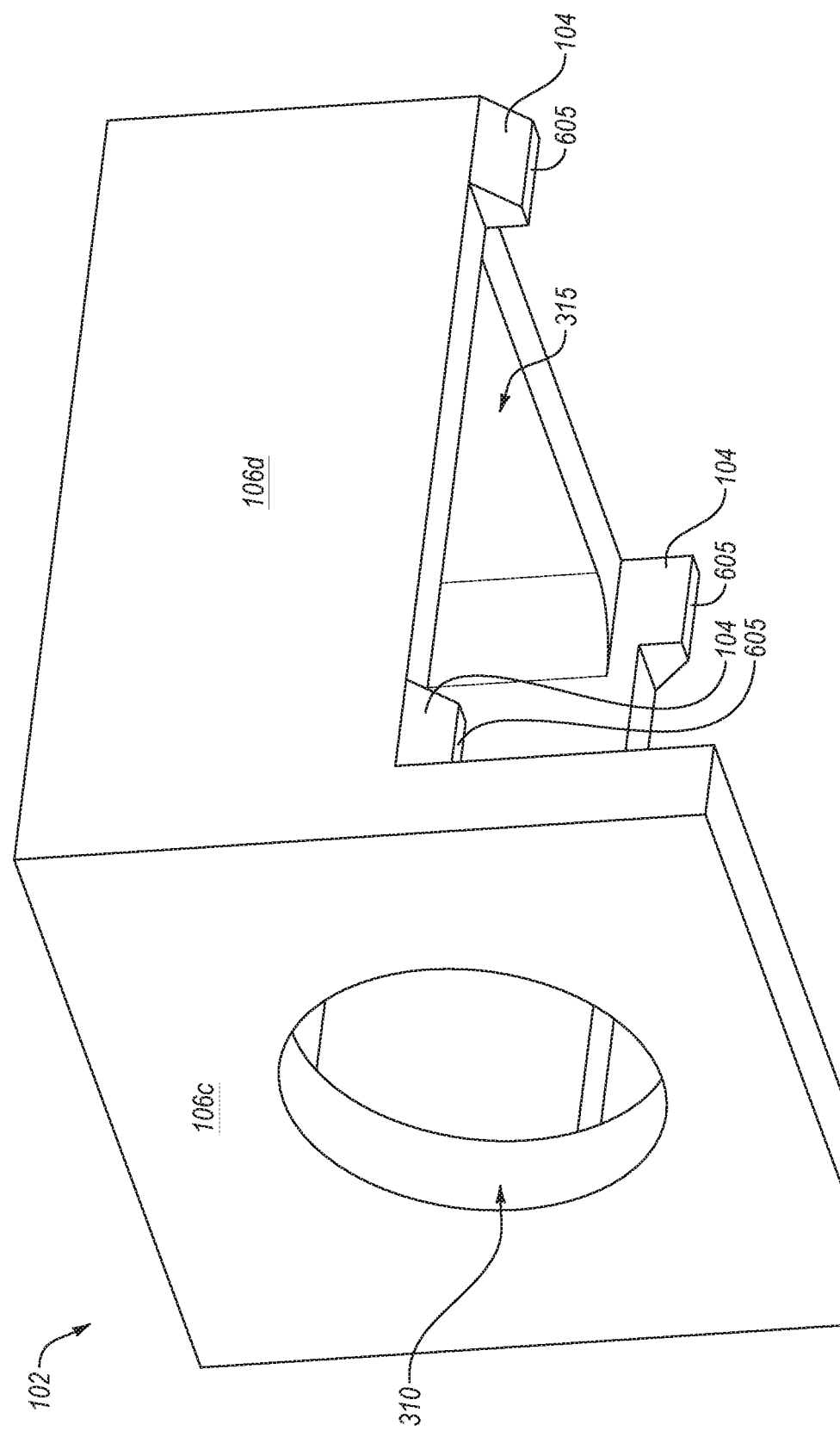
FIG. 7 is a rear perspective view of the cover of FIG. 1.

FIG. 7 is a rear perspective view of the cover 102 of FIG. 1, arranged in accordance with at least one embodiment described herein. As illustrated, the cover 102 may include the supports 104, the opening 310, the interior cavity 315, the third sidewall 106c, the fourth sidewall 106d, and the welding surfaces 605.

FIG. 8 is a detail view of one of the supports 104 of the cover 102 of FIG. 1, arranged in accordance with at least one embodiment described herein. One or more of the other supports 104 may have the same, similar, or different configuration. As illustrated, the support 104 includes the welding surface 605, a first portion 805 having a first width 820, and a second portion 810 having a second width 815. The first portion 805 may be more proximate to the welding surface 605 than the second portion 810. The support 104 may be tapered as illustrated in FIG. 8 such that the first portion 805 is narrower than the second portion 810. For example, the first width 820 corresponding to the first portion 805 may be narrower than the second width 815 corresponding to the second portion 810. One or more of the supports 104 of the cover 102 may be tapered as illustrated in FIG. 8

The drawings may be but are not necessarily drawn to scale. The illustrations presented in the present disclosure are not meant to be actual views of any particular apparatus (e.g., device and/or system) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method and/or the drawings may depict some components and/or some operations that may be omitted in some embodiments.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to.").

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C" or "one or more of A, B, and C" is used, in general such a construction is intended to include A alone, B alone, C alone, A and B together, A and C together, B and C together, or A, B, and C together. For example, the use of the term "and/or" is intended to be construed in this manner. Additionally, the terms "about" and "approximately" should be interpreted to mean within 10% of an actual value.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

Additionally, the use of the terms "first," "second," "third," and other suitable terms are not necessarily used herein to connote a specific order or number of elements. Generally, the terms "first," "second," "third," and other suitable terms are used to distinguish between different elements as generic identifiers. Absence a showing that the terms "first," "second," "third," and other suitable terms connote a specific order, these terms should not be understood to connote a specific order. Furthermore, absence a showing that the terms "first," "second," "third," and other suitable terms connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A cover comprising:
    a plurality of walls that defines an interior cavity within the plurality of walls;
    a plurality of supports that extend from one or more walls of the plurality of walls;
    a gap defined between first and second supports of the plurality of supports, the first and second supports extending from an edge of a first wall of the plurality of walls, the gap bound on first and second opposing sides of the gap by the first and second supports and bound by the edge of the first wall on a third side of the gap that intersects the first and second opposing sides, the gap sized and shaped to receive a portion of a flex circuit into the interior cavity; and
    an opening disposed in a second wall of the plurality of walls, the opening sized and shaped to receive at least a portion of a barrel, the second wall different than the first wall.

2. The cover of claim 1, wherein each of the plurality of supports is tapered.

3. The cover of claim 1, wherein the plurality of supports each include a welding surface.

4. The cover of claim 3, wherein each of the plurality of supports is tapered such that a first portion of the plurality of supports is narrower than a second portion of the plurality of supports, the first portion more proximate to the welding surface than the second portion.

5. The cover of claim 3, wherein the welding surface of each of the plurality of supports is perpendicular to each wall of the plurality of walls.

6. The cover of claim 3, wherein the welding surface of each of the plurality of supports does not exceed one or more respective planes defined by the plurality of walls.

7. The cover of claim 1, further comprising a filler material disposed in the gap.

8. The cover of claim 1, wherein each of the plurality of supports extends from a portion of the one or more walls of the plurality of walls.

9. An optical subassembly comprising:
a heat sink stiffener;
a barrel;
a flex circuit;
a cover comprising:
  a plurality of walls that defines an interior cavity within the plurality of walls;
  a plurality of supports that extend from one or more walls of the plurality of walls, each of the plurality of supports welded to the heat sink stiffener;
  a gap defined between first and second supports of the plurality of supports, the first and second supports extending from an edge of a first wall of the plurality of walls, the gap bound on first and second opposing sides of the gap by the first and second supports and bound by the edge of the first wall on a third side of the gap that intersects the first and second opposing sides, the gap sized and shaped to receive a portion of the flex circuit into the interior cavity; and
  an opening disposed in a second wall of the plurality of walls, at least a portion of the barrel received into the opening, the second wall different than the first wall;
wherein the flex circuit is positioned such that a portion of the flex circuit is received through the gap into the interior cavity and a portion is positioned externally.

10. The optical subassembly of claim 9, further comprising:
a laser coupled to the flex circuit; and
a lens positioned between the laser and the barrel,
wherein the lens and the laser are both positioned within the interior cavity.

11. The optical subassembly of claim 10, further comprising:
a driver electrically coupled to the laser; and
a power detection monitor (PDM) positioned to detect power of the laser,
wherein the driver and the PDM are both positioned within the interior cavity.

12. The optical subassembly of claim 11, wherein the laser, the lens, the driver, and the PDM are positioned between a top wall of the cover and the heat sink stiffener.

13. The optical subassembly of claim 9, wherein each of the plurality of supports includes a welding surface that is welded to the heat sink stiffener.

14. The optical subassembly of claim 13, wherein each of the plurality of supports is tapered such that a first portion of each of the plurality of supports is narrower than a second portion of each of the plurality of supports, the first portion more proximate to the welding surface than the second portion.

15. The optical subassembly of claim 13, wherein the welding surface of each of the plurality of supports is perpendicular to each wall of the plurality of walls.

16. The optical subassembly of claim 13, wherein the welding surface of each of the plurality of supports does not exceed one or more respective planes defined by the plurality of walls.

17. A module comprising:
a housing that defines a housing cavity;
a heat sink stiffener disposed within the housing cavity;
a barrel disposed within the housing cavity;
a flex circuit disposed within the housing cavity;
a cover disposed within the housing cavity, the cover comprising:
  a plurality of walls that defines an interior cavity within the plurality of walls;
  a plurality of supports that extend from one or more walls of the plurality of walls, each of the plurality of supports welded to the heat sink stiffener;
  a gap defined between first and second supports of the plurality of supports, the first and second supports extending from an edge of a first wall of the plurality of walls, the gap bound on first and second opposing sides of the gap by the first and second supports and bound by the edge of the first wall on a third side of the gap that intersects the first and second opposing sides, the gap sized and shaped to receive a portion of the flex circuit into the interior cavity; and
  an opening disposed in a second wall of the plurality of walls, at least a portion of the barrel received into the opening, the second wall different than the first wall;
wherein the flex circuit is positioned such that at least a portion of the flex circuit is received through the gap into the interior cavity of the cover, another portion is positioned external to the cover, and the flex circuit is communicatively coupled to a host device.

18. The module of claim 17, further comprising:
a laser coupled to the flex circuit;
a lens positioned between the laser and the barrel;
a driver electrically coupled to the laser; and
a power detection monitor (PDM) positioned to detect power of the laser,
wherein the laser, the lens, the driver, and the PDM are each positioned within the interior cavity.

19. The module of claim 18, wherein the laser, the lens, the driver, and the PDM are positioned between a top wall of the cover and the heat sink stiffener.

20. The module of claim 17, wherein:
the plurality of supports of the cover each includes a welding surface that is welded to the heat sink stiffener;
each of the plurality of supports is tapered such that a first portion of each of the plurality of supports is narrower than a second portion of each of the plurality of supports, the first portion more proximate to the welding surface than the second portion;
the welding surface of each of the plurality of supports is perpendicular to each wall of the plurality of walls; and
the welding surface of each of the plurality of supports does not exceed one or more respective planes defined by the plurality of walls.

* * * * *